(12) United States Patent
Nicolosi et al.

(10) Patent No.: US 6,684,890 B2
(45) Date of Patent: Feb. 3, 2004

(54) MEGASONIC CLEANER PROBE SYSTEM WITH GASIFIED FLUID

(75) Inventors: Tom Nicolosi, Mission Viejo, CA (US); Yi Wu, Irvine, CA (US)

(73) Assignee: Verteq, Inc., Santa Ana, CA (US)

( * ) Notice: Subject to any disclaimer, the term of this patent is extended or adjusted under 35 U.S.C. 154(b) by 195 days.

(21) Appl. No.: 09/906,384

(22) Filed: Jul. 16, 2001

(65) Prior Publication Data

US 2003/0015216 A1 Jan. 23, 2003

(51) Int. Cl.$^7$ ................................................. B08B 3/00
(52) U.S. Cl. ...................... 134/148; 134/147; 134/151; 134/184; 134/902; 134/1; 134/1.3; 134/2; 134/31; 134/33; 134/32; 134/34; 438/906
(58) Field of Search .......................... 134/1, 1.3, 2, 31, 134/32, 33, 34, 147, 148, 151, 184, 198, 902; 438/906

(56) References Cited

U.S. PATENT DOCUMENTS

| | | | |
|---|---|---|---|
| 4,537,511 A | * | 8/1985 | Frei ............................ 366/127 |
| 5,427,622 A | | 6/1995 | Stanasolovich et al. |
| 5,656,097 A | | 8/1997 | Olesen et al. |
| 5,800,626 A | | 9/1998 | Cohen et al. |
| 5,985,811 A | | 11/1999 | Masayuki et al. |
| 6,039,059 A | | 3/2000 | Bran |
| 6,325,081 B1 | | 12/2001 | Miki et al. |

FOREIGN PATENT DOCUMENTS

| | | | |
|---|---|---|---|
| JP | WO 98/01896 | | 3/1997 |
| JP | 411008214 | * | 1/1999 |
| JP | 2000325902 | * | 11/2000 |

OTHER PUBLICATIONS

Nicolosi et al., "Front End of Line Wet Processing for Advanced Critical Cleans," Electrochemical Society Proceedings Honolulu (1999).

Yi Wu "Development of an Experimentally Validated Model of Megasonic Cleaning," Doctoral Thesis 1997.

"Study on Megasonic in Advanced Wet Cleaning Process," Electrochemical Society Proceedings vol. 95–20.

Nicolosi et al., "Front End of Line Wet Processing for Advanced Critical Cleans," Electrochemical Society Proceedings Honolulu (1999).

Yi Wu "Development of an Experimentally Validated Model of Megasonic Cleaning," Doctoral Thesis 1997.

"Ultra Pure Water Monitoring Guidelines 2000," Balazs Analytical Laboratory, 1999.

* cited by examiner

Primary Examiner—Randy Gulakowski
Assistant Examiner—M. Kornakov
(74) Attorney, Agent, or Firm—Knobbe Martens Olson & Bear LLP

(57) ABSTRACT

In accordance with one embodiment there is provided a method of improving the performance of a substrate cleaner of the type having a megasonic probe with a probe shaft extending generally parallel to a surface of a rotating substrate, and at least one dispenser for applying a cleaning liquid onto the surface of the substrate, wherein the megasonic probe agitates the liquid on the surface. The method comprising dissolving gas in the liquid before the liquid reaches the dispenser. In accordance with another embodiment, an apparatus for cleaning substrates comprises a rotary fixture which is adapted to support a substrate and rotate the substrate about a first axis, a probe having a probe shaft extending generally parallel to a surface of the substrate, and a megasonic transducer in acoustically coupled relation to the probe. The apparatus further comprises at least one dispenser that applies a cleaning liquid drawn from a cleaning liquid supply onto a surface of the substrate, and a gasifier operatively associated with the cleaning liquid supply. The gasifier causes gas to dissolve in the cleaning liquid.

16 Claims, 2 Drawing Sheets

MEGASONIC CLEANER PROBE SYSTEM WITH GASIFIED FLUID

BACKGROUND OF THE INVENTION

1. Field of the Invention

The disclosure herein relates to an apparatus and method for cleaning semiconductor wafers or other such items requiring extremely high levels of cleanliness.

2. Description of the Related Art

Megasonic cleaning systems are widely used within the semiconductor industry for cleaning substrates such as semiconductor wafers, photomasks, flat-panel displays, magnetic heads or any other similar item that requires a high level of cleanliness. In a megasonic cleaner, the substrates are immersed in or otherwise exposed to a cleaning solution, typically water containing a dilute amount of cleaning chemicals. A source of megasonic energy is activated to agitate the solution and create a cleaning action at the exposed surfaces of the substrates.

In preparing cleaning solutions for megasonic cleaners, gasified water has to date been used only when performing batch cleaning of substrates, such as in an open bath-type megasonic cleaner. For example, U.S. Pat. No. 5,800,626 teaches the use of gasified cleaning solutions in connection with bath-type megasonic cleaning systems. However, gasified cleaning solutions have not been shown to be effective in use with a probe-type megasonic cleaner.

In contrast, with the recent introduction of probe-type megasonic cleaners it has been widely believed unnecessary to gasify the water supplied to the cleaning device, and has even been believed necessary to de-gas the water. Various reasons underlied these beliefs. First, in a probe-type cleaner the megasonic energy source is much closer to the substrate being cleaned; this was thought to obviate the need for any additional cleaning action contributed by the presence or addition of gases dissolved in the solution. In addition, many in the industry believed that the spraying, under pressure, of solution onto the substrate which typically occurs in a probe-type system would aerate the water somewhat and provide the (then presumably modest, if at all) amount of dissolved gas needed for satisfactory cleaning performance with a probe-type cleaner. In other words, it was presumed that the probe-type system would behave in a similar manner as open-tank batch megasonic baths, in which the solution includes gases dissolved from the ambient air. Finally, there has been a fear that excessive oxygen dissolved in the water may react with the hydrogen terminated silicon surface of a substrate and cause, under the high levels of agitation created by a probe-type cleaning system, an unacceptable amount of roughening. As a result, the accepted guideline for probe-type megasonic cleaning processes has been that the water supply contain less than 5 ppb of oxygen in solution.

In light of these widely held beliefs, the inventors were surprised to discover that the gasification of the water used in a probe-type megasonic cleaning system led to substantially improved cleaning performance.

SUMMARY OF THE INVENTION

In accordance with one embodiment there is provided a method of improving the performance of a substrate cleaner of the type having a megasonic probe with a probe shaft extending generally parallel to a surface of a rotating substrate, and at least one dispenser for applying a cleaning liquid onto the surface of the substrate, wherein the megasonic probe agitates the liquid on the surface. The method comprising dissolving gas in the liquid before the liquid reaches the nozzle.

In accordance with another embodiment, an apparatus for cleaning substrates comprises a rotary fixture which is adapted to support a substrate and rotate the substrate about a first axis, a probe having a probe shaft extending generally parallel to a surface of the substrate, and a megasonic transducer in acoustically coupled relation to the probe. The apparatus further comprises at least one dispenser that applies a cleaning liquid drawn from a cleaning liquid supply onto a surface of the substrate, and a gasifier operatively associated with the cleaning liquid supply. The gasifier causes gas to dissolve in the cleaning liquid.

In accordance with yet another embodiment, there is provided an improvement in a substrate cleaner of the type having a megasonic probe with a probe shaft extending generally parallel to a surface of a rotating substrate, and at least one nozzle spraying a cleaning liquid drawn from a cleaning liquid supply onto the surface of the substrate, wherein the megasonic probe agitates the liquid on the surface. The improvement comprises a gasifier operatively associated with the cleaning liquid supply, the gasifier causing gas to dissolve in the cleaning liquid.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

Having thus summarized the general nature of the invention and its essential features and advantages, certain preferred embodiments and modifications thereof will become apparent to those skilled in the art from the detailed description herein having reference to the figures that follow, of which.

DETAILED DESCRIPTION OF THE PREFERRED EMBODIMENT

Figure 1:
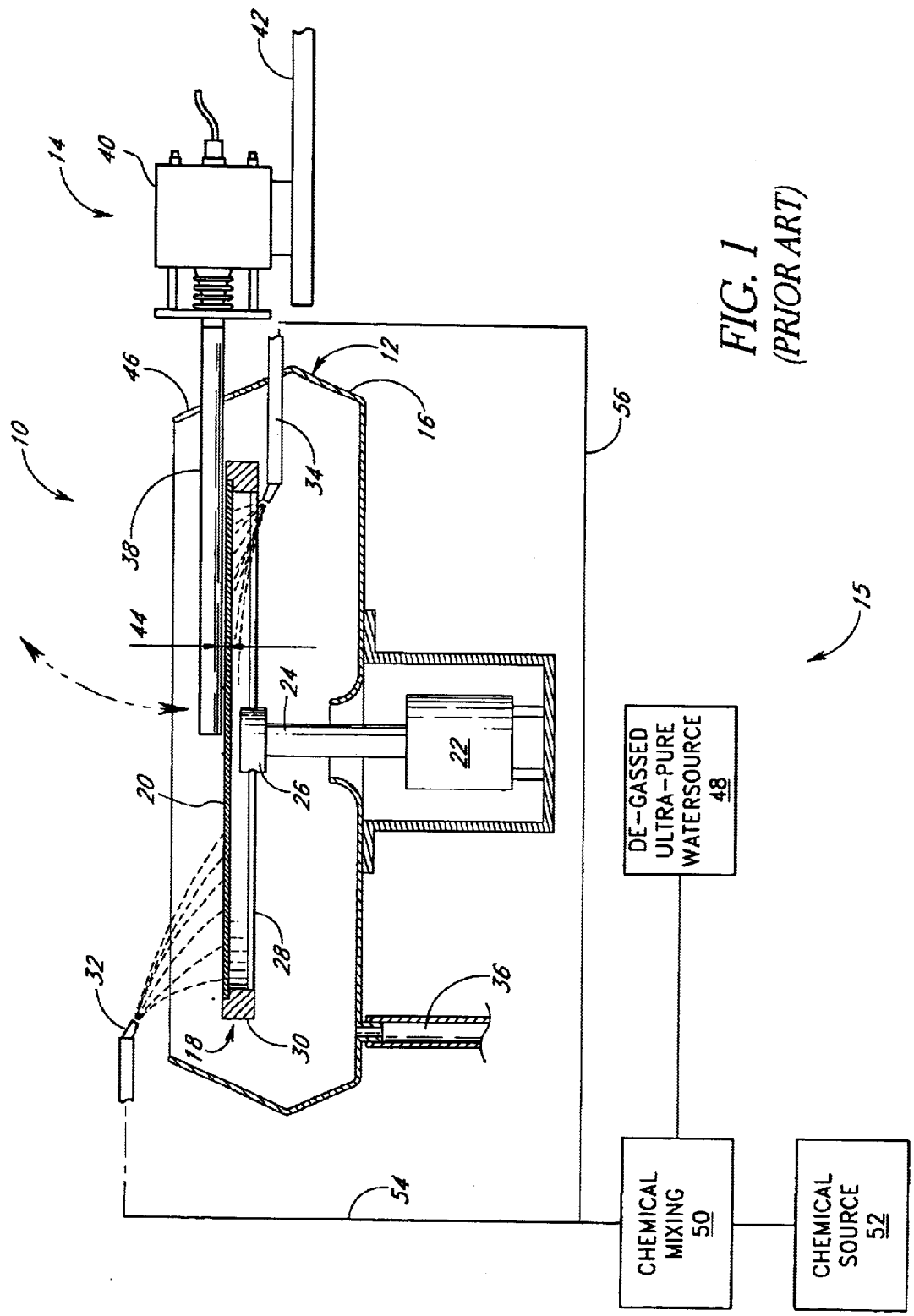
FIG. 1 is a schematic view of a known probe-type megasonic cleaning system and an associated cleaning liquid supply system.

FIG. 1 depicts a known probe-type megasonic cleaning apparatus 10, generally comprising a tank-and-fixture assembly 12, a probe assembly 14 and a cleaning liquid supply system 15. The tank-and-fixture assembly 12 is made up of a tank 16 inside of which is disposed a fixture 18 adapted to support and/or securely hold a substrate 20, which may comprise a semiconductor wafer, photomask, flat-panel display, magnetic heads or any other similar item that requires a high level of cleanliness. The fixture 18 generally comprises a motor 22, shaft 24, hub 26, spokes 28, and an annular rim 30. The rim 30 supports and/or grips the substrate 20 as it is rotated about a generally vertical axis by the motor 22, in cooperation with the shaft, hub, spokes, etc. Upper and/or lower dispensers or nozzles 32, 34 spray a cleaning liquid onto the upper and/or lower surfaces of the substrate 20. A drain line 36 in the lower end of the tank 16 permits accumulated cleaning solution to exit therefrom.

The probe assembly 14 comprises a megasonic probe 38 which is acoustically coupled to a megasonic transducer (not shown) inside of a probe housing 40. The housing 40 is mounted to a support member 42 so that the shaft of the probe 38 extends generally parallel to the surface of the substrate 20 and is separated therefrom by a narrow gap 44. The support member 42, along with the probe assembly 14, is retractable or rotatable upward to allow insertion/removal of substrates to the fixture 18. A slot 46 is provided in the tank 16 to permit rotational movement of the probe 38 in and out of the tank.

In operation, high-frequency electrical power is supplied to the megasonic transducer, which vibrates at a high, megasonic frequency. This vibration is transmitted to the probe 38, which also vibrates at a megasonic frequency. The megasonic vibration of the probe 38 agitates the liquid on the substrate near the probe, creating a cleaning action on the surface of the substrate. Where the lower nozzle 34 is employed to provide cleaning liquid on the lower surface of the substrate 20, this lower-surface liquid is also agitated in the areas nearest the probe. As the substrate rotates under the probe, substantially the entire surface of the substrate is exposed to the cleaning action generated by the probe and agitated liquid.

The cleaning liquid supply system 15 includes a source 48 of de-gassed and ultra-pure water which feeds a chemical mixer 50, in which cleaning chemicals, such as ammonium hydroxide and/or hydrogen peroxide, are added to the ultra-pure water. The cleaning chemicals are drawn from a suitable chemical source 52. Commonly, these chemicals are added at or near the point of use in such proportions as to create a cleaning solution that is ultra-dilute, i.e. having a dilution of 300:1 or more. Such an ultra-dilute solution reduces costs and minimizes unwanted reactions with the substrate surface, such as roughening or etching. Finally, one or more cleaning liquid supply lines 54, 56 carry the mixed cleaning liquid from the mixer 50 to the corresponding nozzle(s) 32, 34 which spray the liquid onto the rotating substrate 20.

Additional details pertaining to megasonic cleaning systems and not necessary to recite here may be found in Assignee's U.S. Pat. No. 6,140,744, issued Oct. 31, 2000 and entitled WAFER CLEANING SYSTEM, the entirety of which is hereby incorporated by reference.

Figure 2:
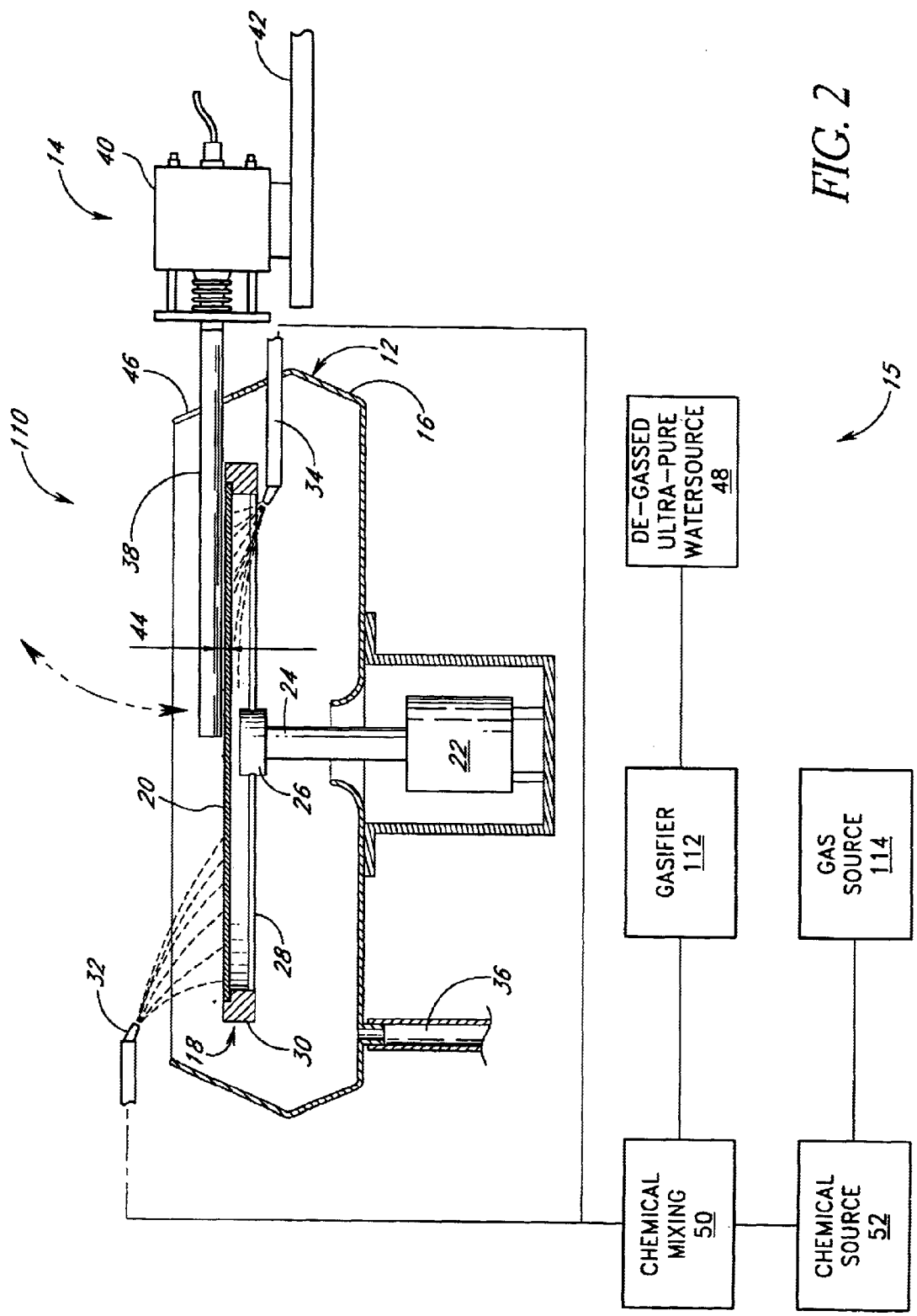
FIG. 2 is a schematic view of the inventive megasonic cleaning system.

FIG. 2 illustrates a preferred embodiment of the inventive cleaning apparatus 110. The apparatus 110 may be generally similar to the prior-art apparatus 10 disclosed above and depicted in FIG. 1, incorporating the probe assembly 14, tank 16, fixture 18, etc. However, the present invention is by no means limited to application in the specific cleaning apparatus 10 disclosed above; one of skill in the art will appreciate that the present invention encompasses use in connection with virtually any megasonic cleaner which generates a standing megasonic wave oriented generally parallel to a surface of a substrate being cleaned. Examples of prior-art megasonic cleaners are disclosed in U.S. Pat. No. 6,140,744, incorporated by reference above.

The apparatus 110 incorporates a gasifier 112 and gas source 114 which are operatively connected to the cleaning liquid supply system 15 so as to inject or dissolve gas into the cleaning liquid. Contrary to the accepted practice for use of probe-type megasonic cleaners, it has been found that the addition of gas to the cleaning liquid provides substantial improvement in cleaning performance.

The gasifier 112 may comprise any conventional gas injection or mixing device, such as a membrane contactor. Alternatively, the gasifier may comprise any chamber or reservoir which facilitates exposure of the cleaning liquid to the desired gas for a sufficient time to allow the gas to dissolve in the liquid. In one embodiment, the liquid is exposed to the gas until equilibrium is reached for the operating pressure and temperature of the gasifier. In another embodiment, the gasifier exposes the liquid to air or other gas(es) at ambient conditions, i.e. room temperature and pressure. In yet another embodiment, the gasifier comprises an injector which delivers gas under a suitable pressure, for example about 30 PSIG, so as to super-charge the water with gas.

The gasifier 112 may add any suitable reactive or nonreactive gas or gases to the cleaning liquid. For example, the gas may comprise air or nitrogen.

Although one skilled in the art can appreciate that the gasifier 112 can be connected to the cleaning liquid supply system 15 at varying locations, where a pressurized gas injector is used it may advantageously be connected as close as possible to the nozzles 32, 34 (and in one embodiment downstream of the chemical mixer 50) so as to maintain a high level of dissolved gas in the water when it leaves the nozzles.

EXAMPLE

In the following example ultra-pure water is employed as the cleaning solution for a semiconductor wafer and none of the commonly-used cleaning chemicals (such as ammonia or hydrogen peroxide) are added. The ultra-pure water source was de-gassed. Two methods were used to dissolve air into the ultra-pure water: 1) the ultra-pure water was poured into a beaker and left open to the atmosphere; and 2) compressed air was injected into an ultra-pure water supply line in an empty filter housing. All processing was done at room temperature. The contaminant used was a silica polishing slurry that was deposited on the wafer with a sponge and then allowed to dry. The contamination was measured by a commercial laser scattering instrument (KLA-Tencor model SP1). Table 1 shows particle counts measured upon contamination and after cleaning with the megasonic device. In the cases where the solution was gasified, cleaning efficiency was significantly improved.

TABLE 1

Effect of Adding Dissolved Air on Megasonic Cleaning of Silica Based Slurry

| | | Particle Count (>0.2 micron size) | | | | |
|---|---|---|---|---|---|---|
| Gasified? (Yes/No) | Aeration Method | Initial | Post Contam. | Post clean | Change | Fraction Removed |
| No | None | 177 | 2248 | 2001 | −247 | 0.12 |
| No | None | 1022 | 3317 | 3059 | −258 | 0.11 |
| No | None | 118 | 2281 | 1697 | −584 | 0.27 |
| No | None | 177 | 2001 | 1910 | −91 | 0.05 |
| No | None | 86 | 2310 | 1878 | −432 | 0.19 |
| No | None | 129 | 6642 | 5703 | −939 | 0.14 |
| No | None | 164 | 9287 | 7929 | −1358 | 0.15 |
| Yes | compressed-air injection | 89 | 7181 | 2657 | −4524 | 0.64 |
| Yes | compressed-air injection | 119 | 7621 | 3347 | −4274 | 0.57 |
| Yes | exposure to ambient | 138 | 2659 | 1473 | −1186 | 0.47 |
| Yes | exposure to ambient | 159 | 2619 | 1342 | −1277 | 0.52 |

TABLE 1-continued

Effect of Adding Dissolved Air on Megasonic Cleaning of Silica Based Slurry

| Gasified? (Yes/No) | Aeration Method | Initial | Particle Count (>0.2 micron size) Post Contam. | Post clean | Change | Fraction Removed |
|---|---|---|---|---|---|---|
| Yes | exposure to ambient | 151 | 2133 | 1565 | −568 | 0.29 |
| Yes | exposure to ambient | 712 | 3279 | 1387 | −1892 | 0.74 |
| Yes | exposure to ambient | 82 | 1769 | 997 | −772 | 0.46 |

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. Thus, it is intended that the scope of the present invention herein disclosed should not be limited by the particular disclosed embodiments described above, but should be determined only by a fair reading of the claims that follow.

What is claimed is:

1. An apparatus for cleaning substrates, said apparatus comprising:
   a rotary fixture which is adapted to support a substrate and rotate said substrate about a first axis;
   a probe having a probe shaft extending generally parallel to a surface of said substrate;
   a megasonic transducer in acoustically coupled relation to said probe;
   at least one dispenser that applies a cleaning liquid drawn from a cleaning liquid supply line onto a surface of said substrate; and
   a gasifier connected to said cleaning liquid supply line, said gasifier causing gas to dissolve in said cleaning liquid.

2. The apparatus of claim 1, wherein said gasifier comprises a membrane contactor.

3. The apparatus of claim 1, wherein said gas comprises air.

4. The apparatus of claim 1, wherein said gas comprises nitrogen.

5. The apparatus of claim 1, wherein said gas comprises a nonreactive gas.

6. The apparatus of claim 1, wherein said gas comprises a reactive gas.

7. The apparatus of claim 1, wherein said cleaning liquid comprises ultra-pure water.

8. The apparatus of claim 1, wherein said cleaning liquid comprises ultra-pure water which is degassed prior to dissolving said gas in said cleaning liquid.

9. In a substrate cleaner of the type having a megasonic probe with a probe shaft extending generally parallel to a surface of a rotating substrate, and at least one nozzle spraying a cleaning liquid drawn from a cleaning liquid supply line onto said surface of said substrate, wherein said megasonic probe agitates said liquid on said surface, the improvement comprising a gasifier connected to said cleaning liquid supply line, said gasifier causing gas to dissolve in said cleaning liquid.

10. The apparatus of claim 9, wherein said gasifier comprises a membrane contactor.

11. The apparatus of claim 9, wherein said gas comprises air.

12. The apparatus of claim 9, wherein said gas comprises nitrogen.

13. The apparatus of claim 9, wherein said gas comprises a nonreactive gas.

14. The apparatus of claim 9, wherein said gas comprises a reactive gas.

15. The apparatus of claim 9, wherein said cleaning liquid comprises ultra-pure water.

16. The apparatus of claim 9, wherein said cleaning liquid comprises ultra-pure water which is degassed prior to dissolving said gas in said cleaning liquid.

* * * * *